United States Patent
Kim et al.

(12)

(10) Patent No.: US 12,414,244 B2
(45) Date of Patent: Sep. 9, 2025

(54) MAGNETICALLY MOUNTABLE CABLE HUB

(71) Applicant: Shopify Inc., Ottawa (CA)

(72) Inventors: Jonathan Kim, Toronto (CA); Andrew Ferrier, Montreal (CA); David Waddell, Nelson (CA); Michael Joseph Defazio, Fonthill (CA); Silvana Zaldivar, Toronto (CA)

(73) Assignee: Shopify Inc., Ottawa (CA)

( * ) Notice: Subject to any disclaimer, the term of this patent is extended or adjusted under 35 U.S.C. 154(b) by 449 days.

(21) Appl. No.: 17/882,279

(22) Filed: Aug. 5, 2022

(65) Prior Publication Data

US 2024/0049405 A1   Feb. 8, 2024

(51) Int. Cl.
 *H05K 5/00* (2025.01)
 *G06F 1/16* (2006.01)
 *H05K 5/02* (2006.01)

(52) U.S. Cl.
 CPC ......... *H05K 5/0073* (2013.01); *G06F 1/1632* (2013.01); *H05K 5/0217* (2013.01); *H05K 5/0047* (2013.01)

(58) Field of Classification Search
 CPC .................................................. H05K 5/0073
 See application file for complete search history.

(56) References Cited

U.S. PATENT DOCUMENTS

| | | | | |
|---|---|---|---|---|
| 5,811,055 A | * | 9/1998 | Geiger | B23K 9/325 266/49 |
| 2008/0110672 A1 | * | 5/2008 | Ryan | H05K 5/0204 174/542 |
| 2023/0181955 A1 | * | 6/2023 | Happonen | A62C 37/38 169/61 |

* cited by examiner

*Primary Examiner* — Hung V Ngo
(74) *Attorney, Agent, or Firm* — HANLEY, FLIGHT & ZIMMERMAN, LLC

(57) ABSTRACT

In one aspect, a cable hub includes a housing having a base and a wall. The base has an interior surface and an exterior surface. A plurality of cable ports is disposed in the wall. A mounting magnet is affixed to the interior surface of the base. The mounting magnet has a sufficient pull strength for magnetically mounting the cable hub to a ferromagnetic surface upon placement of the exterior surface of the base against the ferromagnetic surface. The cable hub may be a Universal Serial Bus (USB) hub. In another aspect, a kit includes the cable hub and at least one ferromagnetic plate. The ferromagnetic plate may be affixable to a surface using an adhesive material.

20 Claims, 10 Drawing Sheets

MAGNETICALLY MOUNTABLE CABLE HUB

TECHNICAL FIELD

The present disclosure relates to cable hubs, and more particularly to a magnetically mountable cable hub.

BACKGROUND

A Universal Serial Bus (USB) hub is an electronic device that can be connected to a host device (e.g., a computer) to increase the number of available USB ports by which peripheral electronic devices may be connected to the host device. In one configuration, the USB hub has a single "upstream-facing" USB port for connection with the host, e.g., via an insertable (male) USB connector, and multiple "downstream-facing" USB ports, each of which may be a (female) USB receptacle. Peripheral devices connected with the downstream-facing USB ports can intercommunicate with the host device via the upstream-facing USB port. The upstream-facing and downstream-facing USB ports may for example be USB Type A (USB-A) ports, USB Type C (USB-C) ports, other types of USB ports, or a combination of these.

A USB hub is one example of a cable hub. Other examples of cable hubs include an Ethernet™ hub, a laptop docking station, or a USB dongle.

SUMMARY

In one aspect, there is provided a cable hub comprising: a housing having a base and a wall, the base having an interior surface and an exterior surface; a plurality of cable ports disposed in the wall; and a mounting magnet affixed to the interior surface of the base, the mounting magnet having a sufficient pull strength for magnetically mounting the cable hub to a ferromagnetic surface upon placement of the exterior surface of the base against the ferromagnetic surface.

In some embodiments, the interior surface of the base defines a recess for the mounting magnet and the mounting magnet is received within the recess.

In some embodiments, the recess is a channel and the magnet is an elongate magnet.

In some embodiments, the mounting magnet is fixed to the interior surface of the base by a resilient adhesive.

In some embodiments, the interior surface of the base defines relief features abutting opposite sides of the mounting magnet.

In some embodiments, the cable hub is a Universal Serial Bus (USB) hub and each of the plurality of cable ports is a USB port.

In some embodiments, the pull strength of the mounting magnet and a coefficient of friction of the exterior surface of the base collectively promote a static force between the base and the ferromagnetic surface that exceeds a minimum necessary force, applied orthogonally to the wall, for connecting or disconnecting a friction-fit USB connector to or from, respectively, one of the USB ports.

In some embodiments, the USB port is a USB type A (USB-A) port and the USB connector is a USB-A connector.

In some embodiments, the USB port is a USB type C (USB-C) port and the USB connector is a USB-C connector.

In some embodiments, the housing is generally cuboid in shape, the wall is a first wall orthogonal to the base, and the cable hub further comprises a second wall opposite the first wall, the second wall having both of a network port and a power adapter socket disposed therein.

In another aspect, there is provided a kit comprising: a ferromagnetic plate; and a cable hub including: a housing having a base and a wall, the base having an interior surface and an exterior surface; a plurality of cable ports disposed in the wall; and a mounting magnet fixed to the interior surface of the base, the mounting magnet having a sufficient pull strength for magnetically mounting the cable hub to the ferromagnetic plate upon affixing of the ferromagnetic plate to a surface and placement of the exterior surface of the base against the ferromagnetic plate.

Some embodiments of kit further comprise an adhesive material on one side of the ferromagnetic plate, the adhesive material configured for the affixing of the ferromagnetic plate to the surface.

In some embodiments, the ferromagnetic plate is a first ferromagnetic plate and the kit further comprises a second ferromagnetic plate.

In some embodiments, the cable hub is a Universal Serial Bus (USB) hub and each of the plurality of cable ports is a USB port.

BRIEF DESCRIPTION OF THE DRAWINGS

In the figures which illustrate example embodiments.

DESCRIPTION

In this document, any use of the term "exemplary" should be understood to mean "an example of" and not necessarily to mean that the example is preferable or optimal in some way. Terms such as "top," "bottom," and "side" may be used to describe features of some embodiments in this description but should not be understood to necessarily connote an orientation of the embodiments during manufacture or use.

Figure 1:
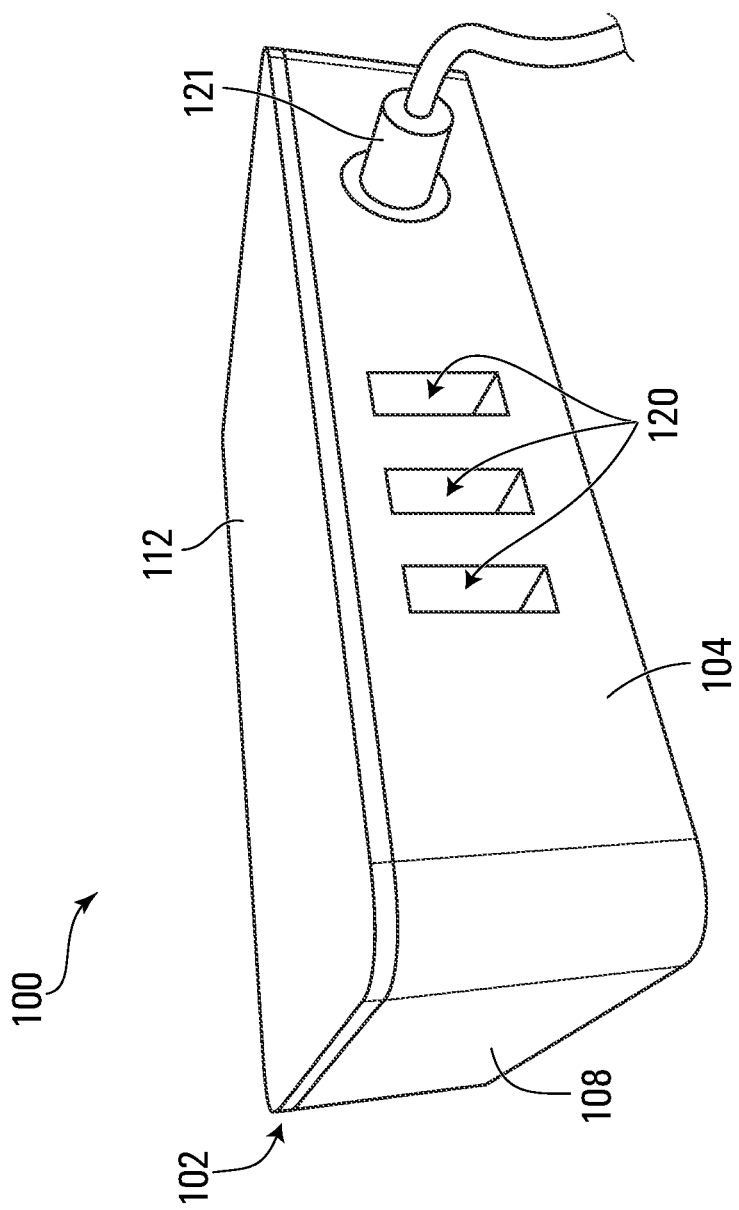
FIG. 1 is a top front perspective view of a magnetically mountable cable hub.
Figure 2:
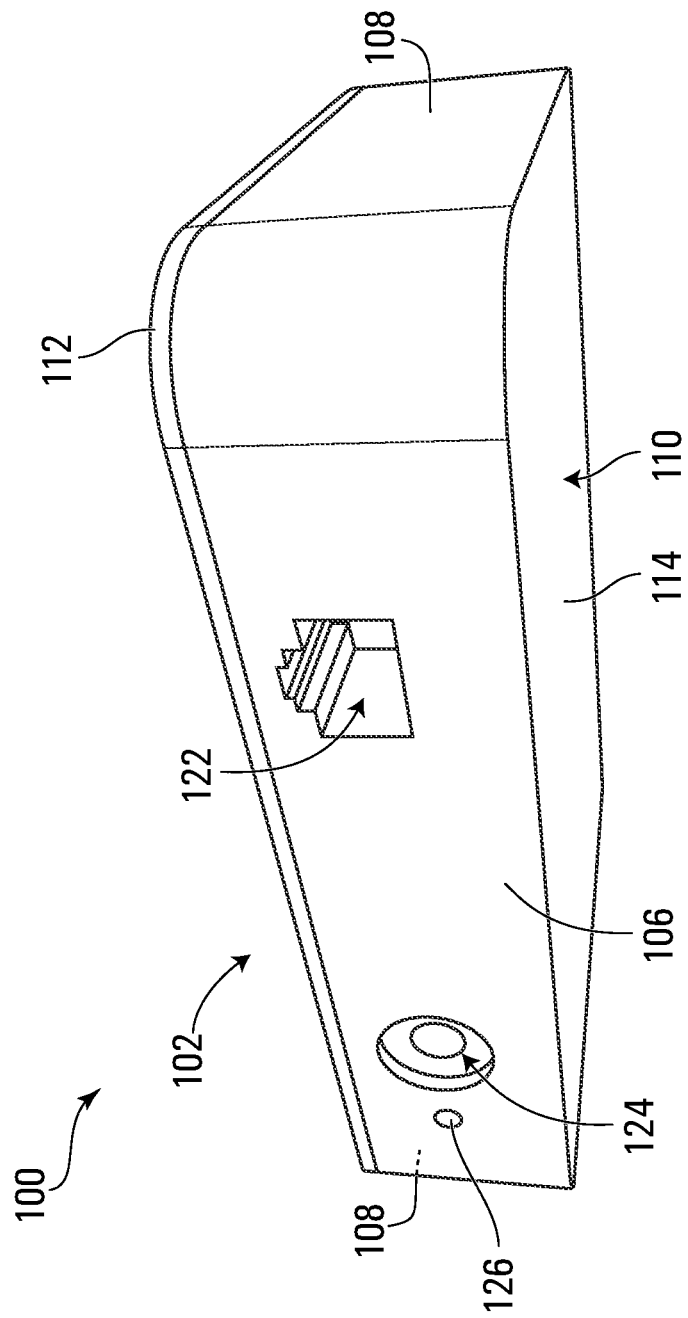
FIG. 2 is a bottom rear perspective view of the cable hub of FIG. 1.
Figure 3:
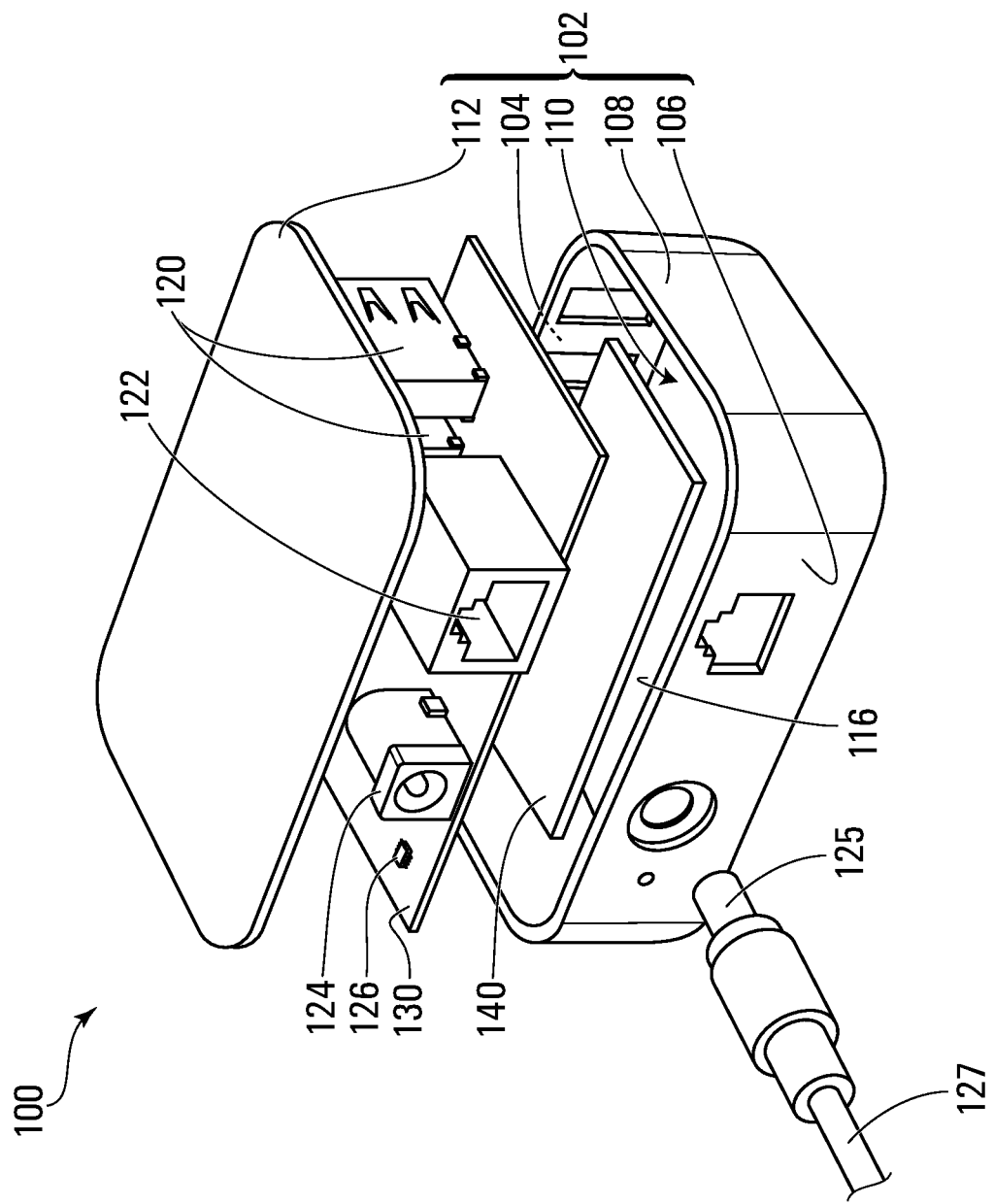
FIG. 3 is an exploded view of the cable hub of FIG. 1.

FIGS. 1 and 2 depict an example embodiment of a cable hub 100 in top front perspective view and bottom rear perspective view, respectively. FIG. 3 is an exploded view of the cable hub 100 of FIGS. 1 and 2. In the present embodiment, the cable hub 100 is a USB hub and may alternatively be referred to as such. In alternative embodiments, the cable hub may be something other than a USB hub, e.g., an Ethernet™ hub.

The cable hub 100 has a housing 102 made from a non-ferromagnetic material, such as Polycarbonate/Acrylonitrile-Butadiene-Styrene (PC/ABS). In the present embodiment, the housing 102 has a substantially cuboid shape with rounded corners. The housing 102 includes a front wall 104, a rear wall 106, two opposed side walls 108, a base 110, and a removable (e.g., snap-fit) cover 112. The base 110 has an exterior surface 114 (FIG. 2) and an interior surface 116 (FIG. 3) and, in the present embodiment, is substantially flat. In alternative embodiments, the exterior surface of the base could be textured for grip or durability, corrugated (e.g., for airflow), and/or substantially concave in at least one dimension (e.g., for mounting to a cylindrical surface).

Three cable ports 120 are disposed in the front wall 104 (see FIGS. 1 and 3). In the present embodiment, the cable ports 120 are USB-A ports, and may thus be referred to as USB ports 120. In alternative embodiments, the cable ports may be other types of USB ports of or non-USB cable ports and may number more than or less than three.

As best seen in FIG. 1, the front wall 104 has a fixed power and data cable 121 disposed therein. In this context, the term "fixed" refers to a non-removable, i.e., permanently attached, cable. In some embodiments, the permanent attachment may serve as an indicator that the cable 121 is an upstream-facing cable. In such embodiments, the cable ports 120, to which data cables are removably connectable, may conversely be understood to be downstream facing. These distinctions may reduce a risk of cable hub 100 misconfiguration and/or a risk of cord tangling during storage or use. The power and data cable 121 is not necessarily fixed in all embodiments.

The power and data cable 121 may terminate with a male connector, such as a male USB-C plug. The cable 121 can be used to carry power and data signals to an interconnected device, such as a countertop tablet stand of a point-of-sale (POS) system with a complementary female receptacle (e.g., a USB-C receptacle), as will be described.

A possible rationale for locating (disposing) the power and data cable 121 in the front wall 104 of the cable hub 100 may be to facilitate reaching a counter-top POS device should the cable hub 100 be mounted under a counter with the rear wall 106 facing rearwardly.

Referring to FIGS. 2 and 3, a network port 122 is disposed in the rear wall 106 of the housing 102. In the present embodiment, the network port 122 is local area network (LAN) port, and more particularly an RJ45 Ethernet™ port. The network port 122 serves as an interface between the cable hub 100 and a LAN and/or the Internet. Also disposed in rear wall 106 are a power port 124 (power adapter socket) and an indicator light 126, which may be an LED. In the present embodiment, the power port 124 is a Direct Current (DC) power port designed to receive a barrel connector 125 of a power adapter cable A possible rationale for locating (disposing) the network port 122 in the rear wall 106 of the cable hub 100, opposite from the front wall 104 in which the cable ports 120 are disposed, may be to reduce a likelihood that a network cable plugged into the network port 122 will interfere with the insertion/disconnection of cables into/from the cable ports 120 in the front wall 104. Another possible rationale for disposing the network port 122 in the rear wall 106 may be to increase a likelihood that the network port 122 will face an RJ45 wall plate socket when the cable hub 100 has been mounted. For example, if the cable hub 100 is mounted under a desk or counter with its front wall 104 facing forward (e.g., for ease of access of cable ports 120), then the rear wall 106 will face rearwardly. In this orientation, the network port 122 may face a wall behind the desk or counter. Since RJ45 wall plate sockets are commonly installed in walls under desks or counters, interconnection of the cable hub 100 with the wall plate socket may be possible with a minimum length of network cable.

The cable ports 120, power and data cable 121, network port 122, power port 124, and indicator light 126 are all electrically and mechanically coupled (e.g., soldered) to a PCB 130 (FIG. 3) that is internal to the housing. In some embodiments, the PCB 130 may include circuitry (not illustrated) for controlling operation of the indicator light 126. In one example, the circuitry may cause the indicator light 126 to illuminate steadily to indicate a power-on status of the cable hub 100. In another example, the circuitry may cause the light 126 to blink in the event of a detected problem with power. In some embodiments, a separate indicator light associated with each cable port 120 (not depicted) may be used indicate, e.g., power or data flow or status for the associated cable port 120.

Referring to FIG. 3, a mounting magnet 140 is affixed to the interior surface 116 of the base 110 of housing 102. A purpose of the mounting magnet 140 is to permit the cable hub 100 to be easily attached to a ferromagnetic surface without tools. In the present embodiment, the mounting magnet 140 has a flattened cuboid shape and an extent that covers a majority of the interior surface 116 of the base 110. The mounting magnet 140 may for example be a rare earth magnet.

In the present embodiment, the mounting magnet 140 is affixed to the interior surface 116 using an adhesive, such as glue. The adhesive may be resilient to help absorb or dissipate any shock that may be imparted upon the housing 102, e.g., to minimize a risk of detachment of the mounting magnet 140 from the interior surface 116. Affixing the mounting magnet 140 internally to the cable hub housing 102 may protect it from external forces that could otherwise result in magnet damage, such as magnet chipping (to which at least some rare earth magnets are susceptible). Internal mounting of the magnet 140 may also limit the amount of force required to detach the cable hub 100 from a ferromagnetic surface. Another potential benefit of internal magnet placement may be hiding the magnet from possible access by a child.

Figure 4:
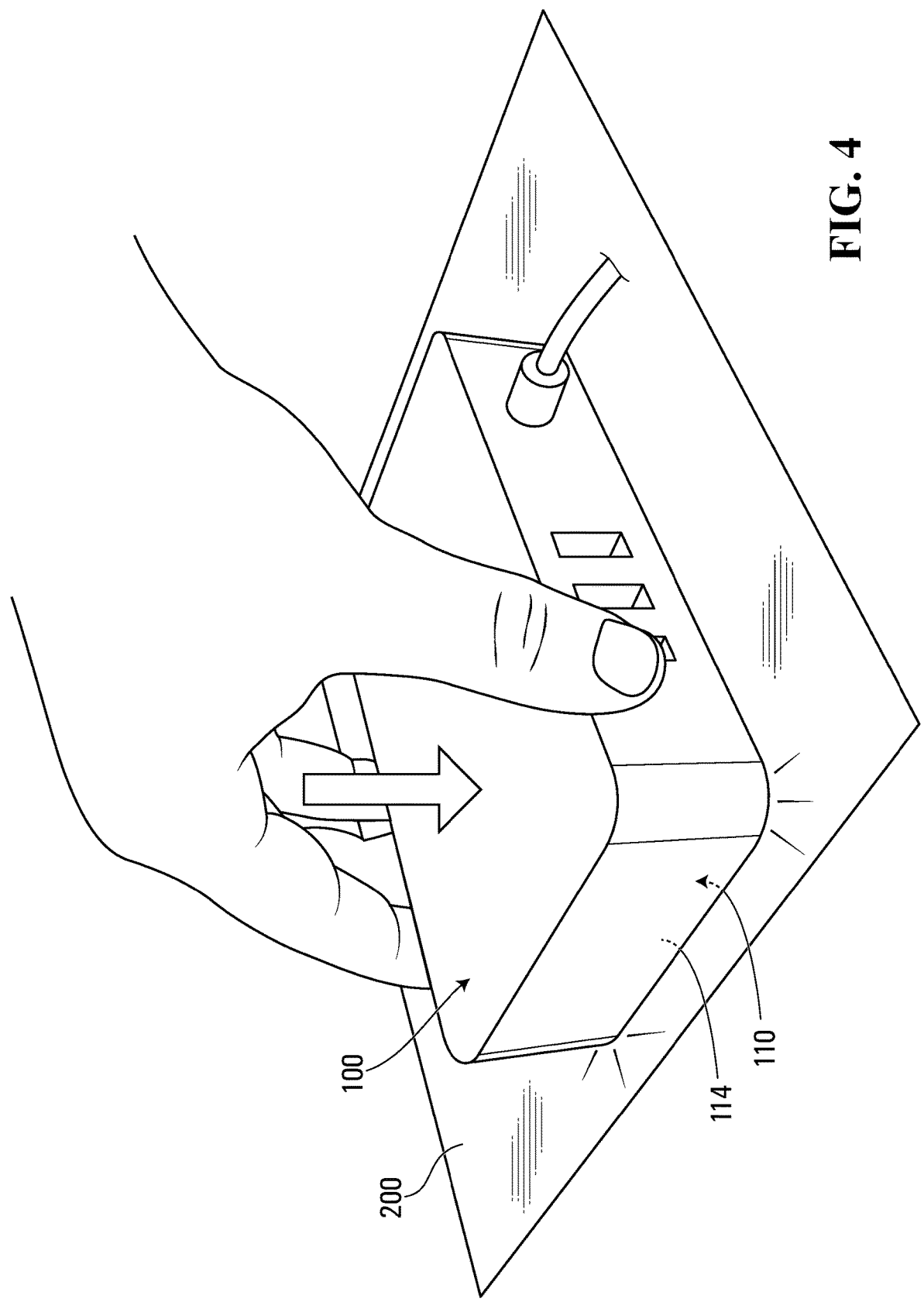
FIG. 4 depicts magnetic mounting of the cable hub of FIG. 1 to a ferromagnetic surface.

FIG. 4 depicts the manner in which a user may mount the cable hub 100 of FIG. 1 to a horizontally oriented ferromagnetic surface 200. To mount the cable hub 100, the user places the exterior surface 114 of the base 110 against the ferromagnetic surface 200. The mounting magnet 140 magnetically attracts the ferromagnetic surface 200 through base 110, thereby causing the cable hub 100 to become mounted to surface 200. Conveniently, no tools are required to mount the cable hub 100. Moreover, the user may easily adjust a position of the cable hub 110 on the ferromagnetic surface 200 without tools simply pulling the cable hub 100 away from the ferromagnetic surface and re-mounting as desired.

The exterior surface 114 of the base of the cable hub 100 may have a high coefficient of friction. Optionally, the pull strength of the mounting magnet 140 (i.e., the extent to which the magnet attracts the ferromagnetic surface 200) and the coefficient of friction of the exterior base surface 114 may be collectively configured to promote the behaviors described below in the context of FIGS. 5 and 6.

Figure 5:
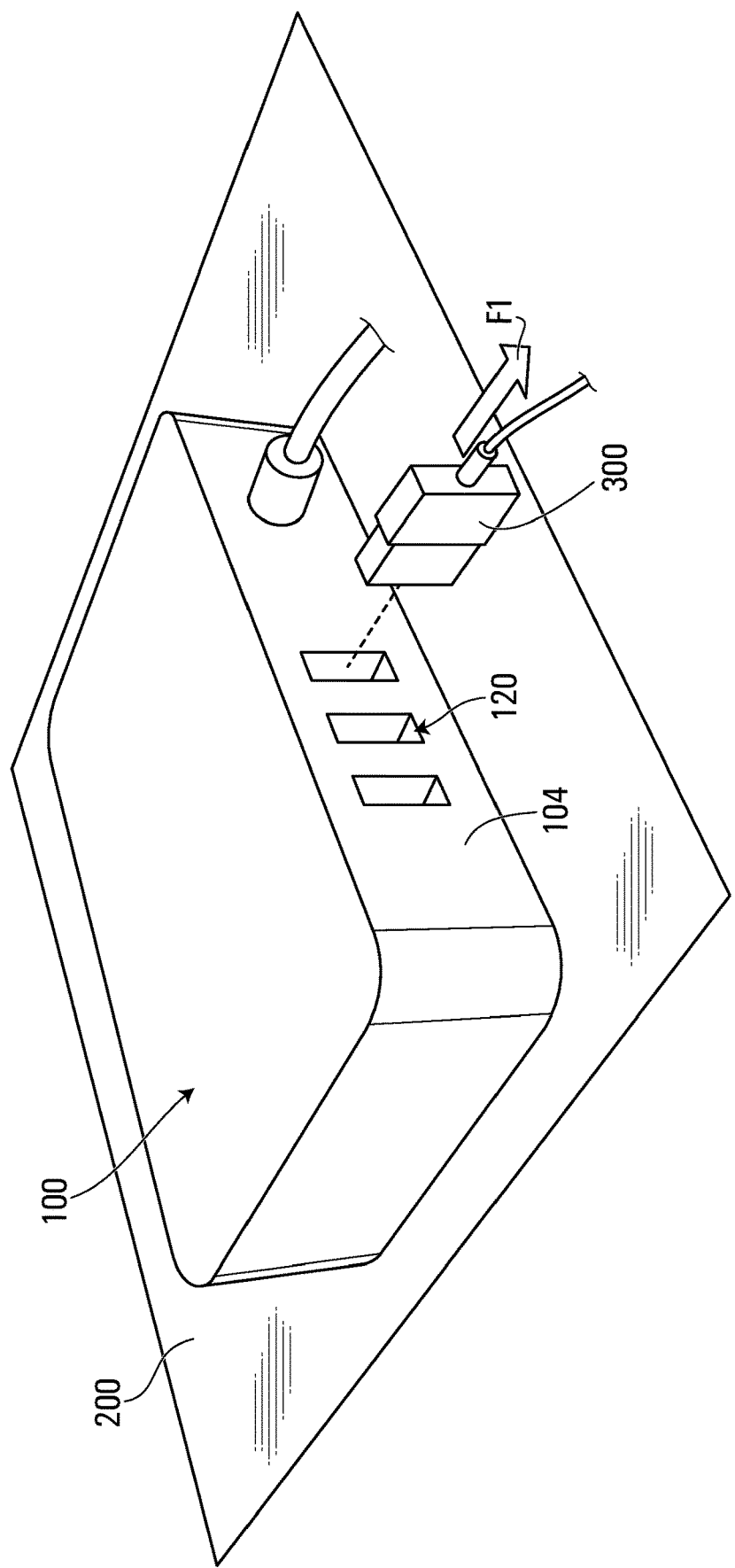
FIG. 5 depicts a first usage scenario of the magnetically mounted cable hub of FIG. 4.

FIG. 5 depicts a disconnection of a friction-fit USB connector 300 (a form of friction-fit cable connector) from one of the USB ports 120 of the cable hub 100. In FIG. 5, the cable hub 100 has been magnetically mounted to ferromagnetic surface 200. A pulling force F1 is applied to the USB connector 300 orthogonally to, and away from, the front wall 104.

In this scenario, the cable hub 100 remains stationary during the disconnection of the USB connector 300. The reason is that the static force resulting at least partly from the magnetic and friction forces collectively are stronger than the pulling force F1. Put another way, the pull strength of the mounting magnet 140 and a coefficient of friction of the exterior surface 114 of the base 110 collectively promote a static force between the base 110 and the ferromagnetic surface 200 that exceeds a minimum necessary force, applied orthogonally to the front wall 104, for connecting or disconnecting a friction-fit USB connector 300 to or from, respectively, one of the USB cable ports 120. The user may thus be able to conveniently disconnect the USB connector 300 from the cable hub 100 using just one hand, i.e., without having to immobilize the cable hub 100 with the other hand. Similarly, it may be possible to insert the USB connector 300 into the USB port 120 using only one hand, by applying a pushing force to the connector 300 that is of equal magnitude to force F1 but in the opposite direction.

Figure 6:
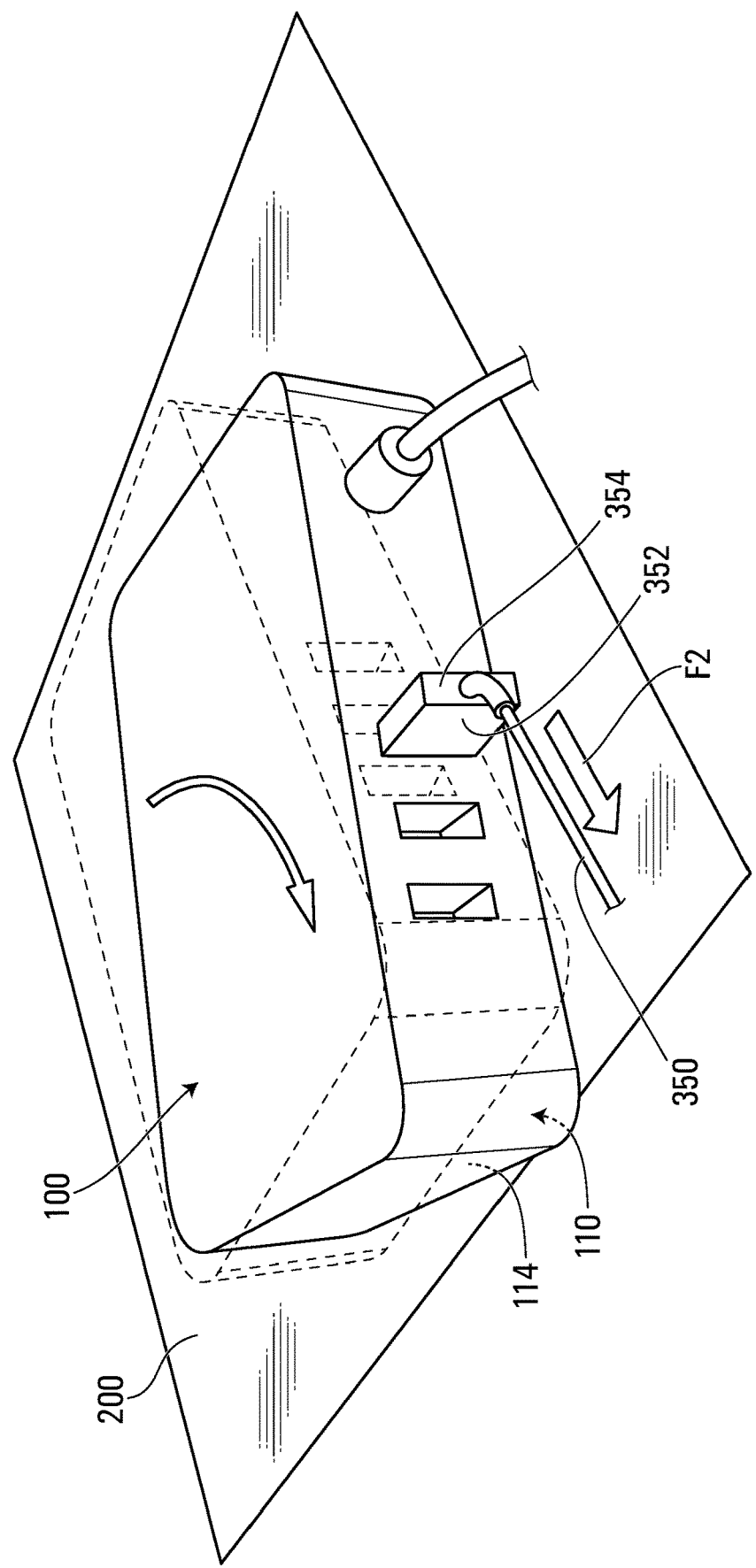
FIG. 6 depicts a second usage scenario of the magnetically mounted cable hub of FIG. 4.

FIG. 6 depicts a second scenario in which a USB cable 350 whose USB connector 352 is plugged into a cable port 120 of the cable hub 100 is subjected to an impulse pulling force F2, e.g., due to inadvertent cable snagging. The pulling force is not orthogonal to the wall as in FIG. 5 but rather is at an acute angle relative to the wall and substantially parallel to the ferromagnetic surface 200 to which the cable hub 100 is mounted.

In the scenario depicted in FIG. 6, the cable hub 100 absorbs some of the impulse force F2 by rotating while remaining magnetically mounted to the ferromagnetic surface 200. Rotation may occur even if the force F2 is identical in magnitude to the force F1 (FIG. 5) that was insufficient for causing the cable hub 100 to slide (translate) along the ferromagnetic surface 200. The reason is that, in this scenario, the force F2 is applied to a distal end 354 of a rigid USB connector 352 protruding from the cable hub 100. Due to torque, the USB connector 352 "magnifies" the impulse force F2 proportionally to the protruding length of the USB connector 352. The magnitude of the resultant magnified force F2' at the USB hub will be greater than the magnitude of the incident impulse force F2. The magnified force F2' exceeds a static friction between the cable hub 100 and the surface 200, causing the cable hub 100 to rotate. In some scenarios, the force F2 may cause both rotation and translation.

The rotation of the cable hub 100 may absorb or dissipate some of the impulse force F2 that would otherwise have been applied to the cable port 120, e.g., if the cable hub 100 were mechanically fixed to the ferromagnetic surface 200. The force F2 may be absorbed partly by the acceleration of the mass of the cable hub 100 from its initial stationary state and partly by friction of the exterior surface 114 of base 110 against the ferromagnetic surface 200. As a result, a risk of damage to the USB cable port 120 from such impulse forces may be reduced in comparison to a fixedly mounted cable hub 100. As well, whatever mechanical coupling may be used to attach the USB cable port 120 to the cable hub 100 (e.g., soldering of the cable port 120 to the PCB 130 and affixing of the PCB 130 to the housing 102), may be subjected to less strain. This may in turn permit lighter or lesser amounts of mechanical coupling material(s) to be used to form the mechanical coupling, which may reduce the weight and/or cost of the cable hub 100. In some embodiments, additional mechanical reinforcement may nevertheless be used to lessen any possible strain upon PCB 130. For example, the additional mechanical reinforcement may be used to connect cable port 120 directly to the housing 102. Rotation may also reduce wear on the cables and/or connected downstream devices.

Figure 7:
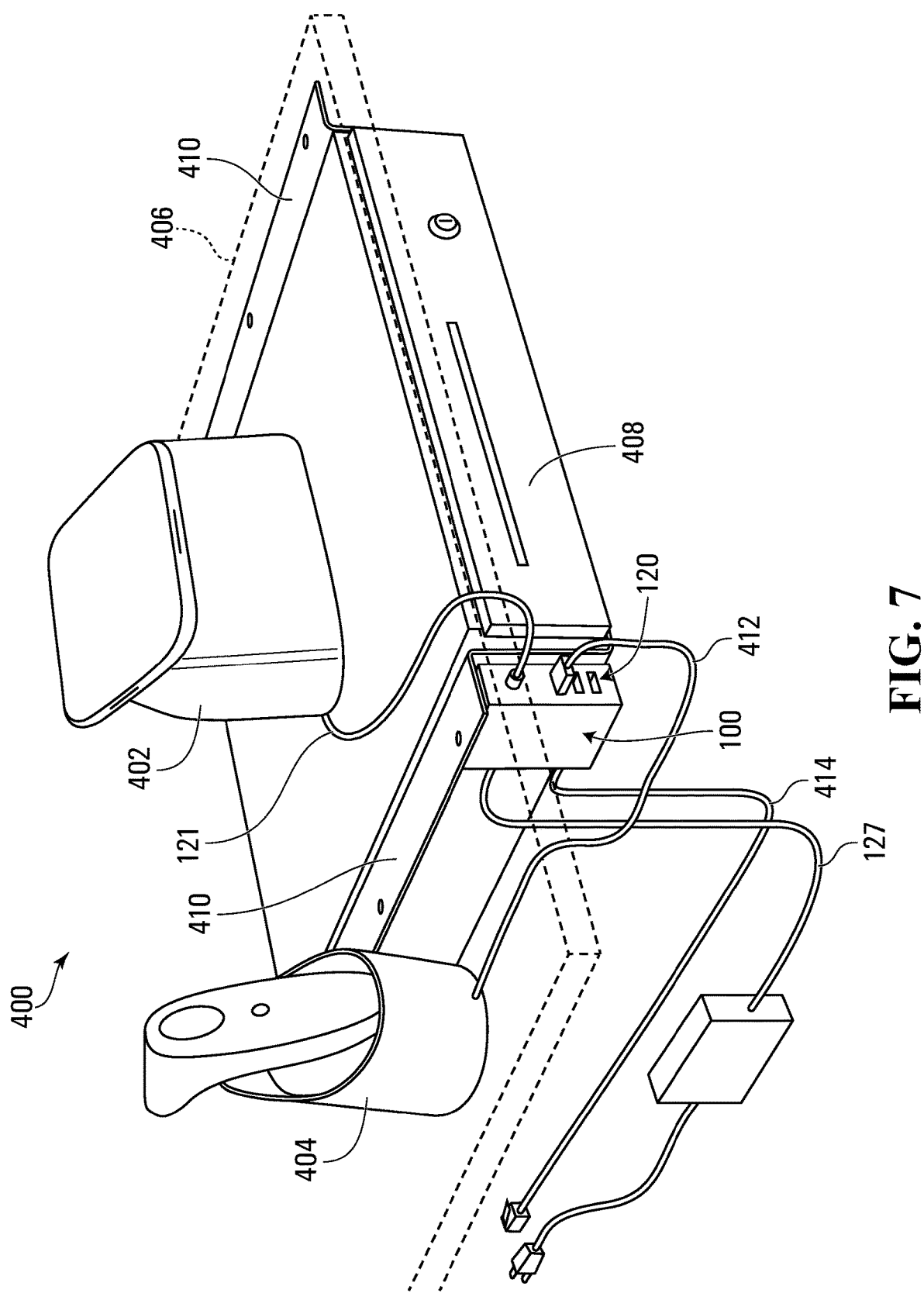
FIG. 7 illustrates an example use of the cable hub of FIG. 1 in a retail setting.

FIG. 7 depicts a possible use of the magnetically mountable cable hub 100 in a retail setting. In FIG. 7, the cable hub 100 provides an easily repositionable electrical interface between an exemplary point-of-sale (POS) system 400 and one or more peripheral devices. The POS system 400 is usable by a merchant to receive payments and track sales at a retail location. The depicted POS system 400 includes a tablet stand 402 and a barcode scanner 404. These components sit atop a counter 406, which may be located at a checkout area of a store.

In FIG. 7, the counter 406 is depicted in dashed lines to reveal under-counter components of the POS system 400. The under-counter components include a metal money drawer 408. In the present embodiment, the money drawer 408 is attached to the underside of the counter 406 by metal brackets 410. It will be appreciated that the money drawer 408 and the brackets 410 are made of metal for security reasons.

In the retail setting depicted in FIG. 7, the cable hub 100 may be conveniently magnetically mounted near (or directly to) the money drawer 408, e.g., to one of the brackets 410 by which the money drawer 408 is mounted to the underside of counter 406. It will be appreciated that, in this example, the ferromagnetic surface 410 to which the cable hub 100 is magnetically mounted is oriented vertically. In this embodiment, the pull strength of the mounting magnet 140 (i.e., the extent to which the magnet 140 attracts the ferromagnetic surface 410) is sufficient to support the weight of the cable hub 100 in a vertical orientation.

The countertop components of the POS system 400 are each connected (communicatively coupled) to the cable hub 100 by a respective cable. In particular, the countertop tablet stand 402 is connected to cable hub 100 via a power and data cable 121. The barcode scanner 404 is connected to the cable hub 100 via USB cable 412. Under the counter 406, a power adapter cable 127 supplies power to the cable hub 100. A network cable 414 (e.g., a Category 6 cable terminated by RJ45 connectors) communicatively couples the cable hub 100, and thus the POS system 400, to a LAN and/or the Internet.

It will be appreciated that magnetic mounting of the cable hub 100 below counter level as shown in FIG. 7 may allow many of the cables 127, 412, and 141 associated with the POS system 400 to be placed underneath the counter 406. This may reduce the number of countertop cables, e.g., in comparison to tabletop USB hub placement, or in comparison to a configuration in which peripherals are connected to, e.g., spare USB ports of the tablet stand 402. The risk of countertop cable snagging may accordingly be reduced. Moreover, because the cable hub 100 may be able to absorb impulse forces applied to connected USB cables in certain directions (in comparison to permanently mounted cable hubs, as described above in connection with FIG. 6), a risk of damage to cable ports 120 may be limited.

If the merchant wishes to add or remove USB-connectible peripheral devices to or from the POS system 400 over time, e.g., as the needs of the merchant change, the cable hub 100 may be temporarily detached, without tools, to facilitate disconnection/connection of USB cables. When the desired cable connections have been made, the cable hub 100 may conveniently be magnetically re-mounted to the bracket 210 in the same location, or possibly in a new location, e.g., if new cable lengths warrant a change in cable hub location.

Figure 8:
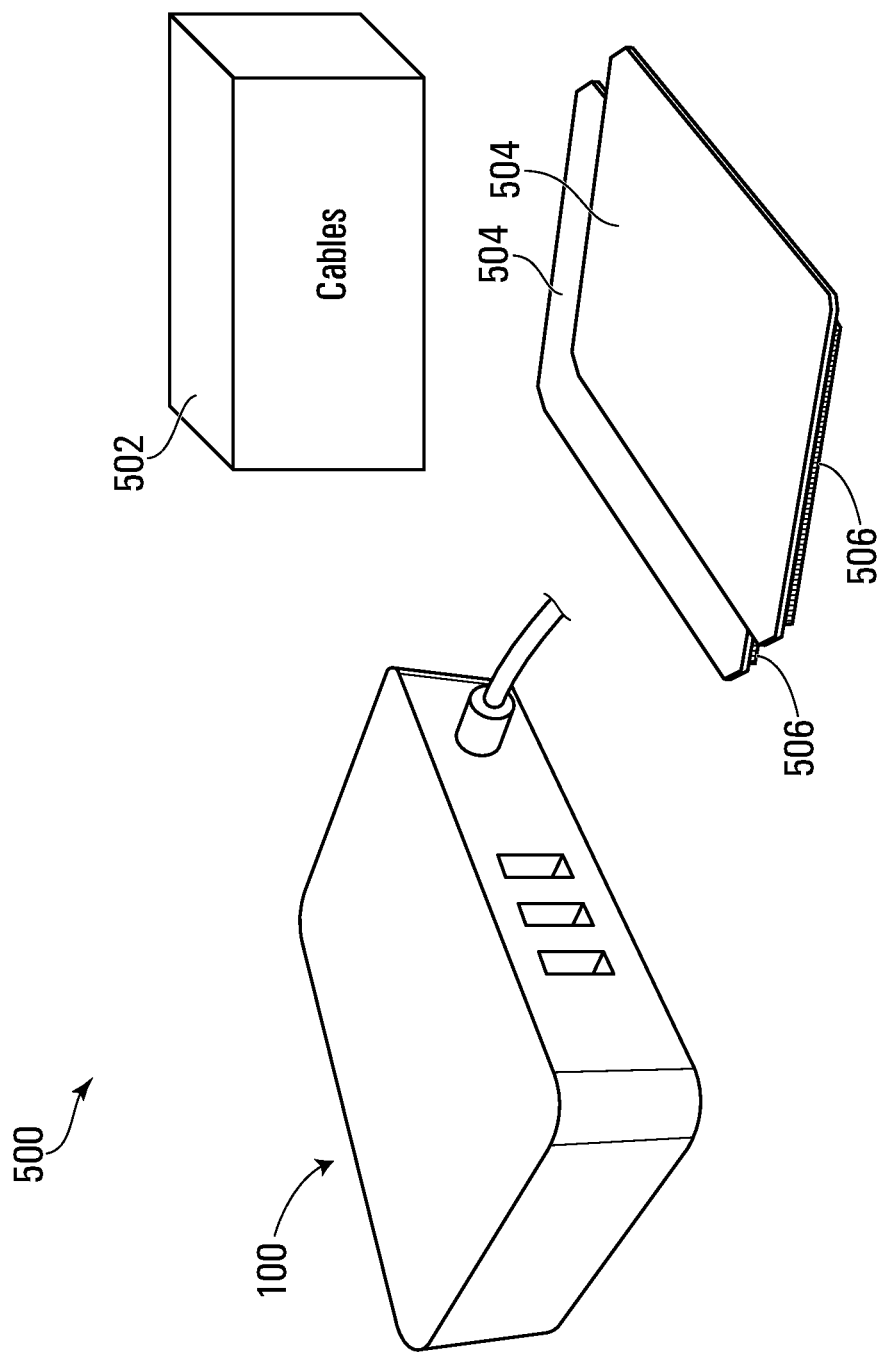
FIG. 8 illustrates a kit by which the magnetically mountable cable hub of FIG. 1 may be commercially sold.

FIG. 8 depicts a kit 500 by which the cable hub 100 may be commercially sold. The example kit 500 includes one cable hub 100, one or more cables, e.g., a power adapter cable and one or more USB cables (depicted inside a box 502 in FIG. 8), and a pair of ferromagnetic plates 504. In this example, each ferromagnetic plate 504 has an adhesive material 506 on one side, such as double-sided mounting tape. The plates 504 may allow the cable hub 100 to be used in settings that otherwise lack ferromagnetic surfaces.

Installation may involve affixing each plate 504 to a surface at a desired installation location using the adhesive material 506. The cable hub 100 may then be selectively magnetically mounted to either one or the other of the plates 504 as needed. The number of plates 504 may be greater or less than two in alternative embodiments of kit 500. In alternative embodiments, the plate(s) 504 may be affixed using mechanisms other than an adhesive material.

Various alternative embodiments are possible.

In some embodiments, the mounting magnet of a cable hub 100 may be received in a recess or channel defined in the interior surface of the base of the housing. An example is depicted in FIG. 9.

Figure 9:
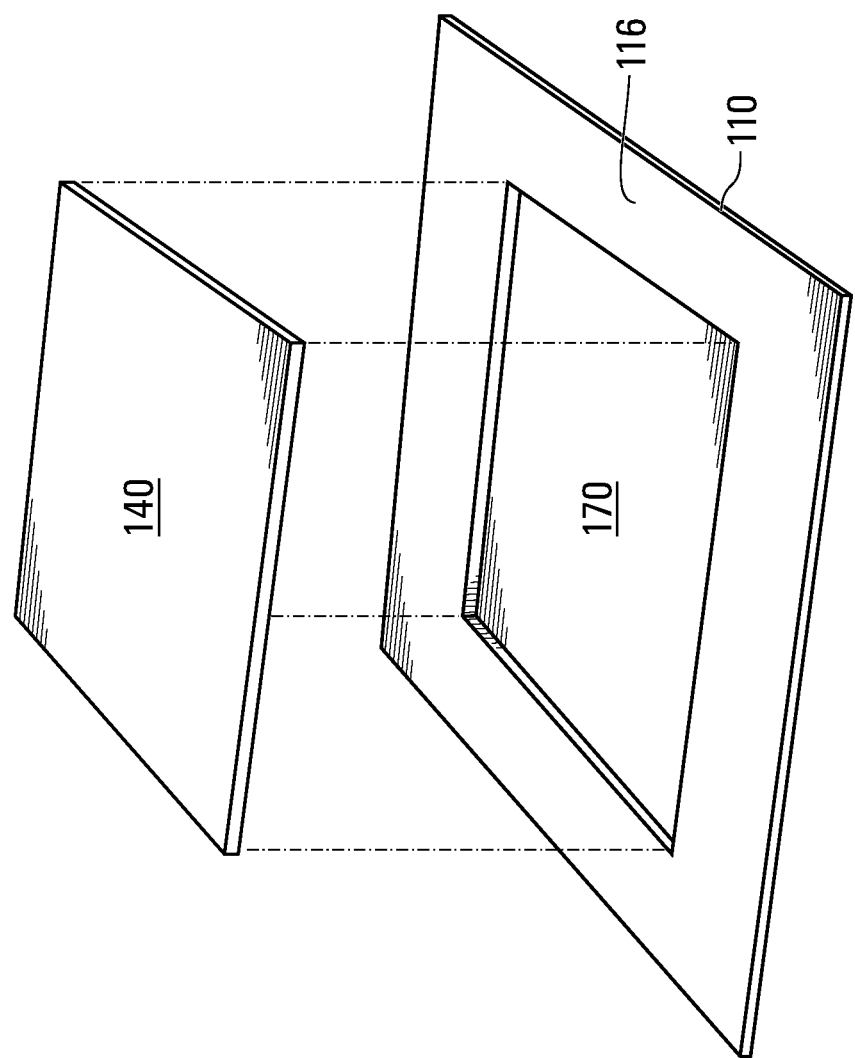
FIG. 9 depicts an example recessed interior surface of a base of a housing of a cable hub configured to receive a mounting magnet.

FIG. 9 depicts a base portion 110 of the cable hub 100 of FIGS. 1-3 in isolation from the remainder of the housing 102. The interior surface 116 of the base 110 has a recess 170 formed therein. In the depicted example, the recess 170 is sized to snugly receive the flattened cuboid-shaped mounting magnet 140. The relative sizing of the recess and the mounting magnet 140 may help to fix the position of the mounting magnet 140 relative to the base 110. An adhesive (not depicted) such as glue may be applied to help affix the mounting magnet 140 to the base 110 within the recess 170. In some embodiments, the mounting magnet may be elongate, and the recess may be a channel.

In some embodiments, the mounting magnet may be abutted on opposite sides by relief features defined on the interior surface of the base. An example is depicted in FIG. 10.

Figure 10:
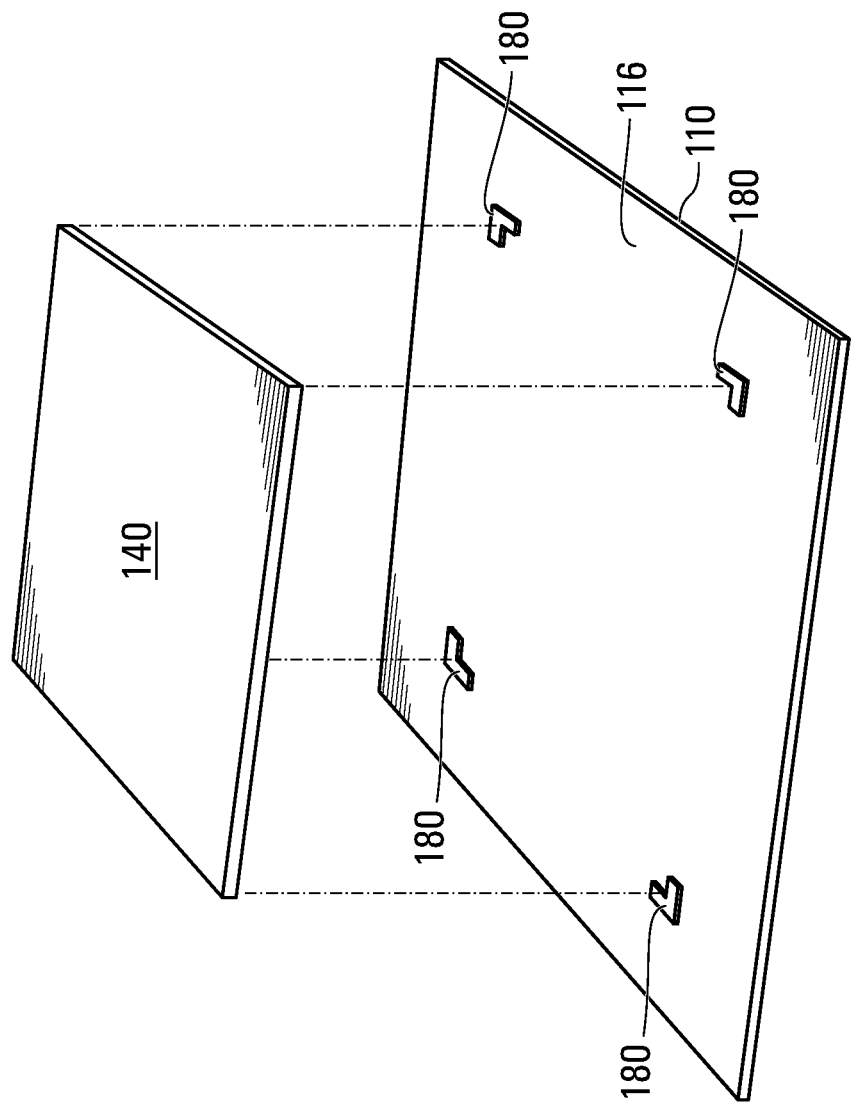
FIG. 10 depicts an example base of a housing of a cable hub having relief features configured to abut a mounting magnet on opposite sides.

FIG. 10 depicts a base portion 110 of the cable hub 100 of FIGS. 1-3 in isolation from the remainder of the housing 102. The interior surface 116 of the base 110 has relief features 180 defined thereupon. In the depicted example, the relief features are L-shaped protuberances. The protuberances may be integrally formed with the base 110, e.g., by way of a molding process by which base 110 may be formed.

In the present embodiment, each of the L-shaped relief features 180 is configured to receive a respective corner of the mounting magnet 140 and abuts the corner from two sides. Collectively, the relief features 180 abut the mounting magnet 140 on opposite sides. This may help to fix the mounting magnet 140 relative to the base 110. An adhesive (not depicted) such as glue may be applied to help affix the mounting magnet 140 to the interior surface 116. In alternative embodiments, the relief features could have other shapes, such as blocks or cylindrical posts. Relief features, if present, may abut the mounting magnet at any location (not necessarily just at the corners of the magnet).

It will be appreciated that the features disclosed in the context of FIGS. 9 and 10, e.g., recesses or channels defined in, and/or relief features defined on, the interior surface 116 of the base, may be combined with features of the cable hub 100 disclosed herein, e.g., as shown in FIGS. 1 to 6 and as described hereinabove.

In alternative embodiments, the mounting magnet may be shaped differently from what is shown in FIGS. 3, 9, and 10. For example, the mounting magnet may be bar-shaped or disk-shaped. In some embodiments, multiple mounting magnets may be used per cable hub 100. Each mounting magnet may be disposed at a different location on the interior surface 116 of the base 110 of housing 102.

In some embodiments, the pull strength of the magnet may be sufficient to support the weight of the cable hub 100 regardless of an orientation of the ferromagnetic surface. For example, the mounting magnet 140 may have a pull strength that is sufficient to magnetically mount the cable hub 100 to a horizontal ferromagnetic surface in an upside-down orientation, i.e., with base 110 facing up and cover 112 facing down.

In some embodiments, the mounting magnet 140 may be translatable, or otherwise movable, towards or away from the base 110, e.g., using one or more leadscrews. This may permit a degree to which the cable hub 100 is attracted to the ferromagnetic surface 200 to be adjusted. In some embodiments, the cable hub 100 may incorporate a microcontroller or CPU communicatively coupled to a force sensor and one or more actuators configured to move the magnet, e.g., via the leadscrew(s). The microcontroller or CPU may be operable to detect, via the force sensor, a current degree of force by which the cable hub 100 is held to the ferromagnetic surface 200. The microcontroller or CPU may be further operable to dynamically adjust the current degree of force by suitably moving the mounting magnet 140.

In at least some embodiments described above, the cable hub 100 incorporates a single PCB 130. In alternative embodiments, multiple interconnected PCBs or other circuitry mounting means may instead be used.

What is claimed is:

1. A cable hub comprising:
    a housing having a base and a wall, the base having an interior surface and an exterior surface;
    a plurality of cable ports in the wall; and
    a mounting magnet affixed to the interior surface of the base, the mounting magnet having a sufficient pull strength for magnetically mounting the cable hub to a ferromagnetic surface upon placement of the exterior surface of the base against the ferromagnetic surface, the mounting magnet enclosed by the housing when the cable hub is magnetically mounted to the ferromagnetic surface.

2. The cable hub of claim 1, wherein the interior surface of the base defines a recess for the mounting magnet and wherein the mounting magnet is received within the recess.

3. The cable hub of claim 2, wherein the recess is a channel and wherein the magnet is an elongate magnet.

4. The cable hub of claim 1, wherein the mounting magnet is fixed to the interior surface of the base by a resilient adhesive.

5. The cable hub of claim 1, wherein the cable hub is a Universal Serial Bus (USB) hub and wherein each of the plurality of cable ports is a USB port.

6. The cable hub of claim 5, wherein the pull strength of the mounting magnet and a coefficient of friction of the exterior surface of the base collectively promote a static force between the base and the ferromagnetic surface that exceeds a minimum necessary force, applied orthogonally to the wall, for connecting or disconnecting a friction-fit USB connector to or from, respectively, one of the USB ports.

7. The cable hub of claim 6, wherein the USB port is a USB type A (USB-A) port and the USB connector is a USB-A connector.

8. The cable hub of claim 6, wherein the USB port is a USB type C (USB-C) port and the USB connector is a USB-C connector.

9. The cable hub of claim 1, wherein the housing is generally cuboid in shape, wherein the wall is a first wall orthogonal to the base, and further including a second wall opposite the first wall, the second wall having both of a network port and a power adapter socket therein.

10. A kit comprising:
a ferromagnetic plate; and
a cable hub including:
   a housing having a base and a wall, the base having an interior surface and an exterior surface;
   a plurality of cable ports disposed in the wall; and
   a mounting magnet fixed to the interior surface of the base, the mounting magnet having a sufficient pull strength for magnetically mounting the cable hub to the ferromagnetic plate upon affixing of the ferromagnetic plate to a surface and placement of the exterior surface of the base against the ferromagnetic plate, the mounting magnet enclosed by the housing when the cable hub is magnetically mounted to the ferromagnetic plate.

11. The kit of claim 10, further comprising including an adhesive material on one side of the ferromagnetic plate, the adhesive material configured for the affixing of the ferromagnetic plate to the surface.

12. The kit of claim 10, wherein the ferromagnetic plate is a first ferromagnetic plate and further including a second ferromagnetic plate.

13. The kit of claim 10, wherein the cable hub is a Universal Serial Bus (USB) hub and wherein each of the plurality of cable ports is a USB port.

14. A cable hub comprising:
a housing having a base and a wall, the base having an interior surface and an exterior surface;
a plurality of cable ports in the wall; and
a mounting magnet affixed to the interior surface of the base, the mounting magnet having a sufficient pull strength for magnetically mounting the cable hub to a ferromagnetic surface upon placement of the exterior surface of the base against the ferromagnetic surface, the interior surface of the base defining relief features abutting opposite sides of the mounting magnet.

15. The cable hub of claim 14, wherein the mounting magnet enclosed by the housing when the cable hub is magnetically mounted to the ferromagnetic surface.

16. The cable hub of claim 14, further including a network port, the network port different than the plurality of cable ports.

17. The cable hub of claim 16, wherein the wall is a first wall and further including a second wall opposite the first wall, the network port in the second wall.

18. The cable hub of claim 14, further including a power port to receive a power adapter cable.

19. The cable hub of claim 14, further including a light emitting diode visible via the housing.

20. The cable hub of claim 14, wherein the relief features include a first relief feature, the first relief feature having a first portion and a second portion, the first portion of the first relief feature abutting a first portion of the mounting magnet and the second portion of the first relief feature abutting a second portion of the mounting magnet.

* * * * *

UNITED STATES PATENT AND TRADEMARK OFFICE
CERTIFICATE OF CORRECTION

| | | |
|---|---|---|
| PATENT NO. | : 12,414,244 B2 | Page 1 of 1 |
| APPLICATION NO. | : 17/882279 | |
| DATED | : September 9, 2025 | |
| INVENTOR(S) | : Kim et al. | |

It is certified that error appears in the above-identified patent and that said Letters Patent is hereby corrected as shown below:

In the Claims

In Column 9, Claim 9, Line 7, delete "both of".
In Column 9, Claim 11, Line 23, delete "comprising".

Signed and Sealed this
Eleventh Day of November, 2025

John A. Squires
*Director of the United States Patent and Trademark Office*